United States Patent

Chen et al.

[11] Patent Number: 5,866,437
[45] Date of Patent: Feb. 2, 1999

[54] DYNAMIC PROCESS WINDOW CONTROL USING SIMULATED WET DATA FROM CURRENT AND PREVIOUS LAYER DATA

[75] Inventors: Ming Chun Chen, Milpitas; Paul J. Steffan, Elk Grove, both of Calif.

[73] Assignee: Advanced Micro Devices, Inc., Sunnyvale, Calif.

[21] Appl. No.: 985,566

[22] Filed: Dec. 5, 1997

[51] Int. Cl.[6] ................................................. H01L 21/66
[52] U.S. Cl. ............................................. 438/14; 438/15
[58] Field of Search .................................. 438/14, 15, 16, 438/17, 18

[56] References Cited

U.S. PATENT DOCUMENTS 5,637,186  6/1997  Liu et al. ................................... 438/14
5,663,076  9/1997  Rostoker et al. .......................... 438/14
5,716,856  2/1998  Lin et al. .................................. 458/14

*Primary Examiner*—Kevin Picardat
*Attorney, Agent, or Firm*—H. Donald Nelson

[57] ABSTRACT

A method of manufacturing semiconductor wafers using a simulation tool to determine predicted wafer electrical test measurements. The simulation tool combines in-line critical dimensions from previous from previous processes run on the current wafer lot, data from previous lots for processes subsequent to the process being run on the current lot and calibration simulation data obtained from the comparison of the predicted wafer electrical test measurements and collected wafer electrical test measurements taken from previous actual wafer electrical test measurements.

1 Claim, 3 Drawing Sheets

DYNAMIC PROCESS WINDOW CONTROL USING SIMULATED WET DATA FROM CURRENT AND PREVIOUS LAYER DATA

BACKGROUND OF THE INVENTION

1. Cross Reference to Related Applications

This application is related to application, Ser. No. 08/985,470, filed on the filing date of this application, entitled AUTOMATIC RECIPE ADJUST AND DOWNLOAD BASED ON PROCESS CONTROL WINDOW and to the application, Ser. No. 08/985,467, filed on the filing date of this application, entitled DISPOSITION TOOL FOR FACTORY PROCESS CONTROL both of which are assigned to the assignee of this application.

2. Field of the Invention

This invention relates generally to the manufacture of high performance integrated circuits on semiconductor devices. More specifically, this invention relates to optimizing the manufacture of high performance integrated circuits on semiconductor devices. Even more specifically, this invention relates to optimizing the manufacture of high performance integrated circuits on semiconductor devices using simulated wafer electrical test data (WET) from current and previous layer data.

3. Discussion of the Related Art

In the typical semiconductor manufacturing facility, many simulation and analysis tools have been implemented to assist the process integration and device development efforts. These simulation and analysis tools, however, are typically employed to provide an indication of general trends. The latent potential of reducing the number of silicon runs and speeding up the process optimization cycle has not been fully achieved. One of the primary reasons the process optimization cycle has not been achieved is that the accuracy of the data obtained cannot be established to the degree necessary to determine the dependability of the simulation systems. The accuracy of the data obtained can only be achieved by a complete and detailed engineering calibration of the simulation system. This calibration, however, demands extensive engineering resources and data from multiple silicon production runs which, in turn, is usually only available at the latter stages of the process development or early production cycles.

In addition, process optimization for a technology that has completed qualification and is ramping-up production could receive great benefit from the extensive embedded device physics contained in advanced complex simulation tools.

Current trends in semiconductor process development include the use of these simulation tools to predict certain wafer electrical tests (WET) device performance characteristics based on a predetermined set of process values. The use of these simulation tools has been very effective. Additionally, optimal performance of current large-scale integrated devices can be predicted by a subset of critical WET performance parameters. These performance criteria include speed, operating temperature, power utilization, and reliability.

Furthermore, current manufacturing technology utilizes in-line statistical evaluation of critical parametric values at most module steps in the overall process flow. These statistical values are used to maintain control of the process, at the particular process module in question, often without regard to previous processing results. Often the goal of manufacturing is to meet not only yield goals, but certain performance goals as well. Currently, to do this it is necessary to force certain values to meet very strict specifications, such as shifting polysilicon gate critical dimensions (CD) or increasing or increasing threshold adjust implant, and hope that other process module variations will not adversely affect performance.

Therefore, what is needed is a method of achieving optimum performance is to have a tool that can provide a process control window or specification for the current module by utilizing the previous process step statistical data as a baseline that is entered into a process simulation tool. Such a process control window would have the potential of being much wider than current specifications due to the previous layer parameters and their effects being precisely known and can be considered dynamic since the process control window can change based on actual previous layer data. The simulation tool would be preset to optimize the process to hit certain critical WET parametrics. Using the previous data baseline, and knowing the WET goals, the simulator tool would then provide direction by providing a process control window for the remaining operations to achieve those goals.

SUMMARY OF THE INVENTION

A dynamic process window control using simulated WET data from current and previous layer data in accordance with the present invention provides a simulation tool that is preset to optimize the process to hit critical WET parametrics.

The above and other objects and advantages of the present invention are attained through a tool that gathers all appropriate previous layer statistical data for the lot in question and reduces it to the appropriate form for introduction to the process simulator. The tool also ascertains the WET goals for the particular lot for achieving certain performance objectives. Knowing the precondition or baseline of the lot and the projected WET goals, the simulator then provides the optimal process parametric targets for the current process module, within the widened process control limits (the wider process control window), to achieve these objectives. If it is impossible to achieve the goal, a disposition of the lot can be made including the lot being downgraded, scrapped, made inactive and a new lot can be assigned to take its place. If the target goals are not met at the current process step, the simulator will recalculate using the new data to choose the target values (process window control) for the next module step and so on until the critical process steps have all been performed.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment of the present invention that illustrates the best mode presently contemplated by the inventors for practicing the invention.

Figure 1:
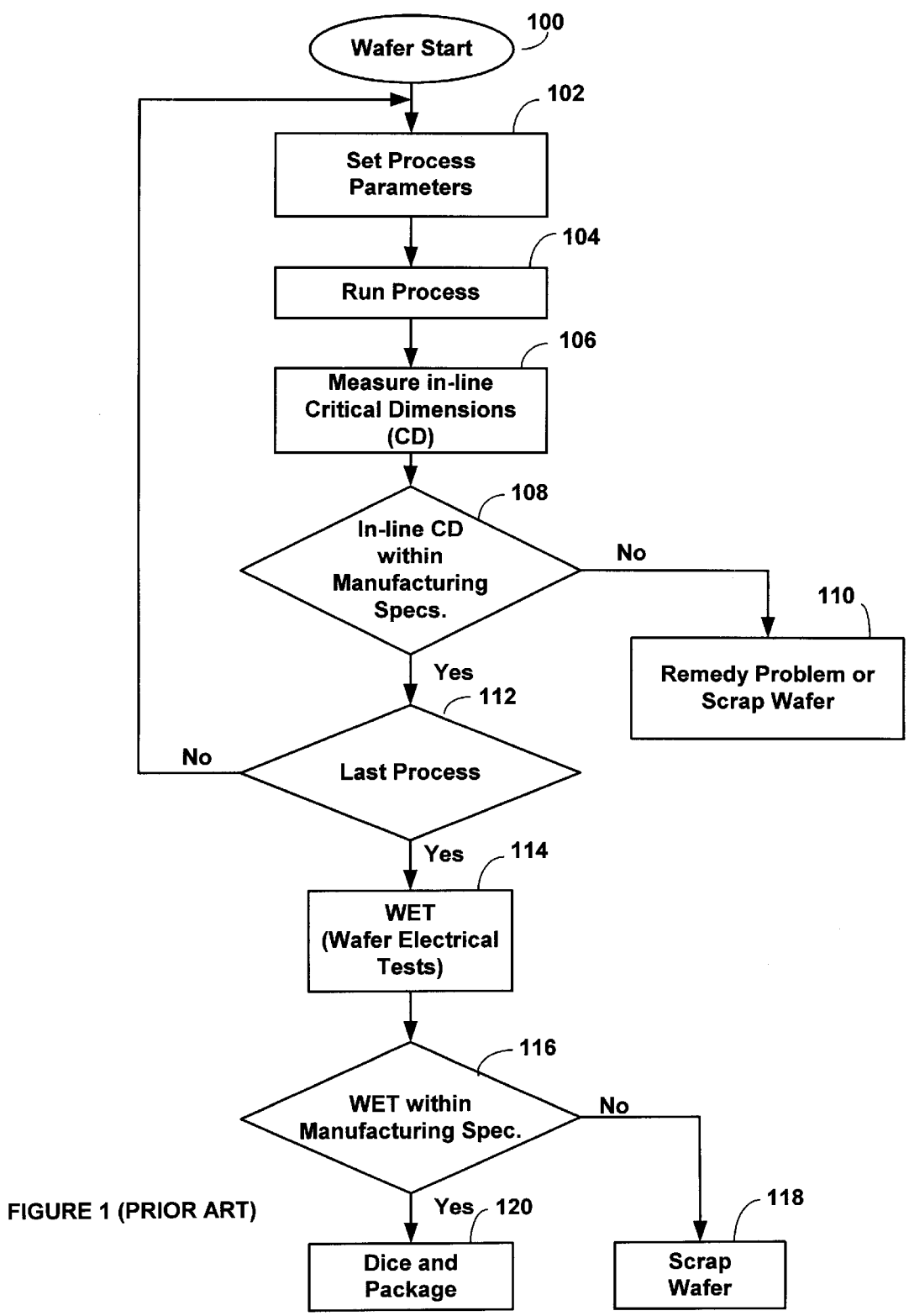
FIG. 1 shows a prior art manufacturing process.

FIG. 1 shows a prior art manufacturing process for the manufacture of semiconductor devices. A wafer lot is started as indicated at 100. The process parameters are set in the process equipment as indicated at 102. The current process is run as indicated at 104. After the current process is completed, the in-line critical dimensions (CD) are measured at 106. At 108, it is determined if the in-line critical dimensions are within preestablished manufacturing specifications. If the in-line critical dimensions are not within the manufacturing specifications, it is attempted to find a remedy as shown at 110, and if a remedy is not available, the wafers are scrapped. If, at 108, it is determined that the in-line critical dimensions are within the manufacturing specifications, it is then determined at 112 if the process just completed is the last process. If it is not the last process, the wafer lot is sent to the next process at 102 where the process parameters for the next process are set in the process equipment. If the process just completed is the last process, the wafer electrical tests (WET) are conducted as indicated at 114. If, at 116, it is determined that the WET measurements are not within the WET manufacturing specifications the wafer lot is scrapped as indicated at 118. If the WET measurements are within the WET manufacturing specifications the wafer lot is sent to the next stage of the manufacturing process, which could be the dice and packaging stage as shown at 120.

Figure 2:
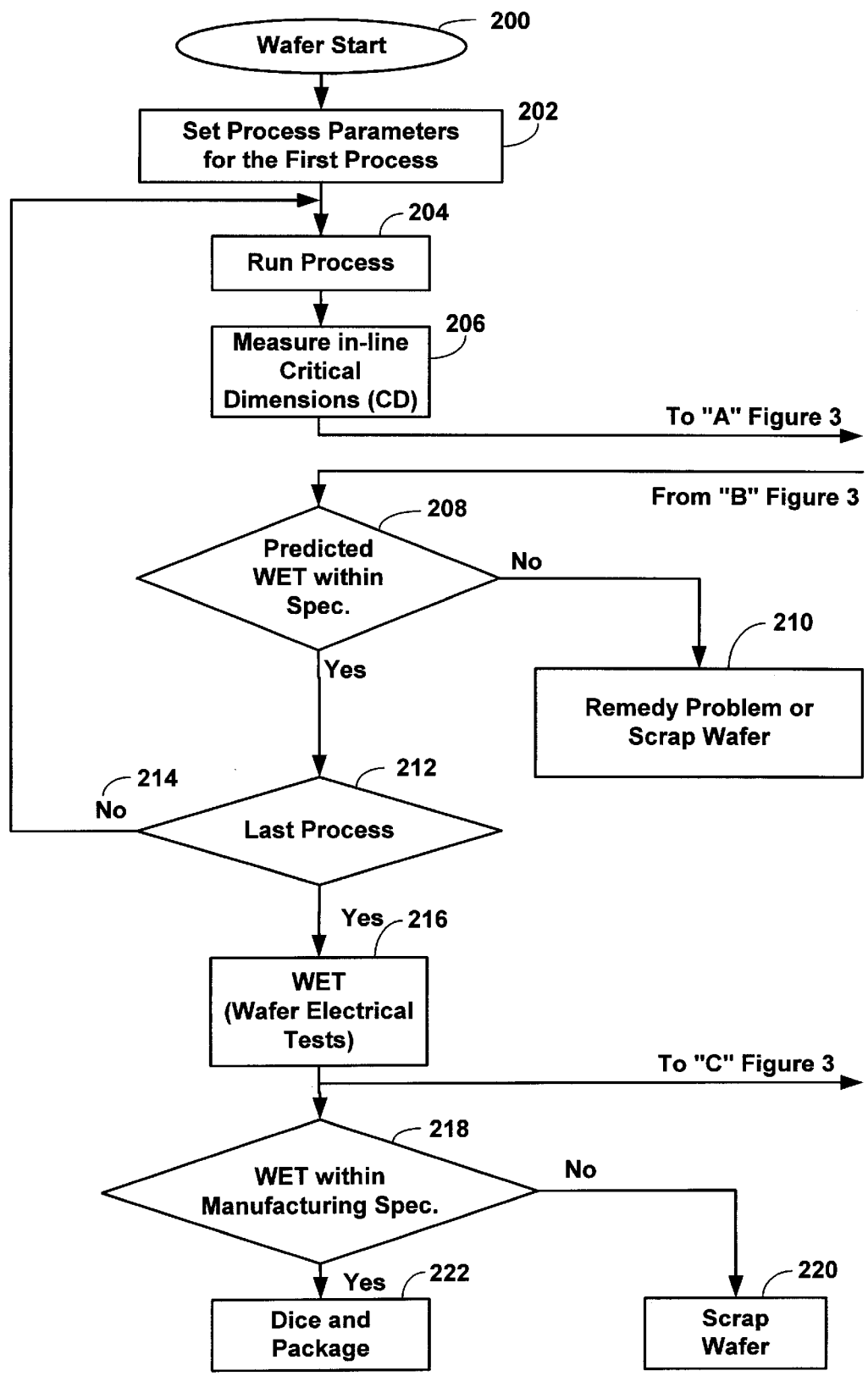
FIGS. 2 & 3 show a manufacturing process in accordance with the present invention.
Figure 3:
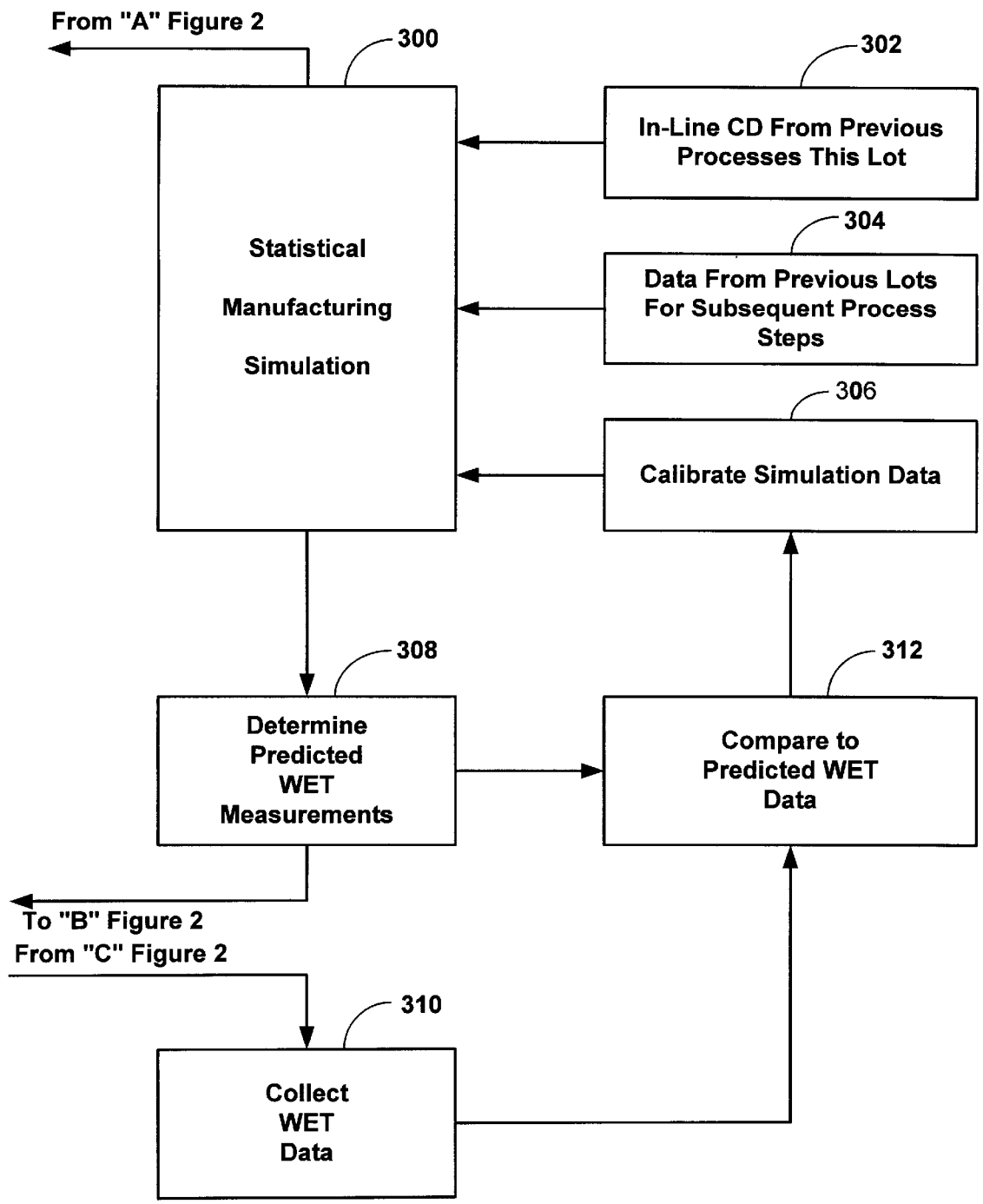

Referring to FIGS. 2 & 3 a wafer manufacturing process flow in accordance with the present invention is shown. In FIG. 2, the wafer lot is started in the manufacturing process, as indicated at 200. The process parameters for the first process are set on the process equipment as indicated at 202. The current process is run as indicated at 204. After the current process is run, the in-line critical dimensions are measured at 206. The in-line critical dimensions are input to a statistical manufacturing simulation at 300, FIG. 3. The statistical manufacturing simulation at 300 is conducted with data from in-line critical dimension measurements from previous processes from this lot as indicated at 302. The statistical manufacturing simulation at 300 is also conducted with data from previous lots for process steps after the current process step as indicated at 304. The statistical manufacturing simulation at 300 also includes calibration simulation data at 306. The calibration simulation data at 306 has input from a comparison made at 312 of the predicted WET measurements at 308 and the collected WET data from all previous process steps at 310. The statistical manufacturing simulation at 300 determines the predicted WET measurements at 308, which are input to the decision step at 208. The predicted WET measurements may provide a widened process control window. This means, for example, that a parameter that is currently being measured may be adjusted to compensate for a parameter that has been previously measured and was either within or without that parameters specification. The widened process control window provides more flexibility to the process control engineer to continue processing a wafer lot and can result in cost savings by not having to scrap wafer lots that can be saved by merely adjusting subsequent process parameters. If it is determined at 208 that the predicted WET measurements are not within the pre-established WET specifications the wafer lot is scrapped if a remedy is not found, as indicated at 210. If it is determined at 208 that the predicted WET measurements are within the pre-established WET specifications, it is then determined at 212 if the current process is the last process. If the current process is not the last process, the wafer lot is sent to the next process as indicated at 214. If the current process is the last process, the WET measurements are conducted as indicated at 216. The results from the WET measurements are sent to a decision point at 218 and to a database 310 FIG. 3. The use of the WET database at 310 is discussed above. If the WET measurements are not within the WET manufacturing specification, the wafer lot is scrapped as indicated at 220. If the WET measurements are within the WET manufacturing specification, the wafer lot is sent to the next stage, as indicated at 222.

The benefits of the present invention include:

1. Allowing the specific targeting of wafer lots to achieve selected performance characteristics.

2. Allows the modification of wafer lot movement to meet production goals.

3. Provides critical information to the process engineers for disposition decisions.

4. Provides for the widening of process specification limits based on calculations from previous layer or process data.

The foregoing description of the embodiments of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of manufacturing semiconductor wafers, the method comprising:

starting a wafer lot in a first process of a manufacturing process;

setting process parameters for the first process and running the first process;

measuring in-line critical dimensions after completion of the first process;

determining predicted wafer electrical test measurements by combining in-line critical dimensions from previous processes run on the wafer lot, data from previous lots for processes to be run subsequent to the process being run on the wafer lot and calibration simulation data obtained from a comparison of the predicted wafer electrical test measurements and collected actual wafer electrical test measurements taken from previous wafer electrical test measurements;

determining if the predicted wafer electrical test measurements are within established wafer electrical test measurement specifications; and if the predicted wafer electrical test measurements are within the established wafer electric test measurement specifications sending the wafer lot to the next process.

* * * * *